(12) United States Patent
Lee et al.

(10) Patent No.: US 9,726,342 B2
(45) Date of Patent: Aug. 8, 2017

(54) OPTICAL MEMBER AND DISPLAY DEVICE HAVING THE SAME

(71) Applicant: LG INNOTEK CO., LTD., Seoul (KR)

(72) Inventors: Gi Seok Lee, Seoul (KR); Eun Sung Seo, Seoul (KR); Hyun Ho Choi, Seoul (KR); Chang Hyuck Lee, Seoul (KR); Ki Cheol Kim, Seoul (KR); Lee Im Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 181 days.

(21) Appl. No.: 14/428,220

(22) PCT Filed: Dec. 14, 2012

(86) PCT No.: PCT/KR2012/010927
§ 371 (c)(1),
(2) Date: Mar. 13, 2015

(87) PCT Pub. No.: WO2014/042318
PCT Pub. Date: Mar. 20, 2014

(65) Prior Publication Data
US 2015/0241020 A1 Aug. 27, 2015

(30) Foreign Application Priority Data

Sep. 14, 2012 (KR) .................. 10-2012-0102435

(51) Int. Cl.
*F21V 7/00* (2006.01)
*F21V 5/04* (2006.01)
(Continued)

(52) U.S. Cl.
CPC .................. *F21V 5/04* (2013.01); *F21V 7/00* (2013.01); *G02B 3/02* (2013.01);
(Continued)

(58) Field of Classification Search
CPC ..... F21V 5/04; F21V 7/00; G02B 3/02; G02F 1/133603; G02F 2001/133607; G02F 33/58; G02F 33/60
(Continued)

(56) References Cited

U.S. PATENT DOCUMENTS 8,213,093 B2 7/2012 Bak et al.
2005/0024746 A1* 2/2005 Shimura .................. F21V 5/045
359/742

(Continued)

FOREIGN PATENT DOCUMENTS

EP 1717627 A1 11/2006
JP 2002-344027 A 11/2002
(Continued)

OTHER PUBLICATIONS

Office Action dated Jan. 15, 2015 in Taiwanese Application No. 101149918.
(Continued)

*Primary Examiner* — Anh Mai
*Assistant Examiner* — Glenn Zimmerman
(74) *Attorney, Agent, or Firm* — Saliwanchik, Llyod & Eisenschenk

(57) ABSTRACT

The exemplary embodiments of the present invention include a driving substrate, a light source arranged on the driving substrate, a luminous flux control member arranged on the light source, and lug members arranged at a bottom surface of the luminous flux control member and extended to a direction of the light source.

20 Claims, 4 Drawing Sheets

(51) Int. Cl.
  *G02F 1/1335* (2006.01)
  *G02B 3/02* (2006.01)
  *H01L 33/58* (2010.01)
  *H01L 33/60* (2010.01)
(52) U.S. Cl.
  CPC .......... *G02F 1/133603* (2013.01); *G02F 2001/133607* (2013.01); *H01L 33/58* (2013.01); *H01L 33/60* (2013.01)
(58) Field of Classification Search
  USPC .................... 362/297, 308, 309, 311.01
  See application file for complete search history.

(56) References Cited

U.S. PATENT DOCUMENTS

| | | | | |
|---|---|---|---|---|
| 2006/0227431 A1* | 10/2006 | Yoon | ............. | G02B 3/04 359/708 |
| 2009/0180286 A1* | 7/2009 | Bamba | ............. | F21V 5/045 362/297 |
| 2010/0208166 A1 | 8/2010 | Iiyama et al. | | |
| 2011/0007505 A1* | 1/2011 | Wang | ............. | F21S 8/086 362/235 |
| 2011/0051426 A1* | 3/2011 | Huang | ............. | F21V 5/04 362/309 |
| 2011/0114979 A1* | 5/2011 | Jang | ............. | H01L 33/486 257/98 |
| 2012/0014115 A1 | 1/2012 | Park et al. | | |
| 2012/0113621 A1* | 5/2012 | Lee | ............. | H01L 33/54 362/97.1 |
| 2012/0287677 A1* | 11/2012 | Wheatley | ............. | G02B 6/0051 362/627 |

FOREIGN PATENT DOCUMENTS

| | | | |
|---|---|---|---|
| JP | 2006-179494 A | 7/2006 | |
| JP | 2010262818 A | 11/2010 | |
| WO | WO 2011071728 A1 * | 6/2011 | ........... G02B 6/0051 |

OTHER PUBLICATIONS

International Search Report dated Jun. 25, 2013 in International Application No. PCT/KR2012/010927, filed Dec. 14, 2012.
European Search Report dated Oct. 30, 2015 in European Application No. 12884495.8.

* cited by examiner

OPTICAL MEMBER AND DISPLAY DEVICE HAVING THE SAME

CROSS-REFERENCE TO RELATED APPLICATIONS

This application is the U.S. national stage application of International Patent Application No. PCT/KR2012/010927, filed Dec. 14, 2012, which claims priority to Korean Application No. 10-2012-0102435, filed Sep. 14, 2012, the disclosures of each of which are incorporated herein by reference in their entirety.

TECHNICAL FIELD

The teachings in accordance with exemplary and non-limiting embodiments of this invention relate generally to an optical member and a display device having the same.

BACKGROUND ART

Generally, due to the characteristics of light weight, slim thickness, low electric power consumption, the liquid crystal display device (or, LCD) is being widely applied. Concomitant with this wide application, the LCD is used for office automation devices and audio/video devices. The LCD displays a picture data (or an image) by using the physical property of crystal that changes array in response to voltage or temperature. That is, in general, the liquid crystal display device (LCD) displays a picture by making each of liquid crystal cells in a matrix of liquid crystal cells at a liquid crystal display panel to control light transmissivity according to a video signal.

As the LCD is not a self-luminescent element, the LCD requires, at a rear surface of the liquid crystal display panel, a backlight unit (BLU) for irradiating light to the liquid crystal display panel for displaying an image. That is, liquid crystal display (LCD) panels, which are mounted to display devices or the like, do not have a self-luminous function. For this reason, a backlight unit (BLU) is disposed at the rear of such an LCD panel, to generate light and to provide the generated light to the LCD panel.

Generally, an LCD includes an array substrate, a color filter substrate, a layer of liquid crystal panel provided between the array substrate and the color filter substrate, and a backlight unit emitting light to the liquid crystal panel.

There may be two kinds of the backlight units for the LCD, one is the direct type backlight unit and the other is the edge type backlight unit. The edge type backlight unit includes a light guide panel and light emitting diodes. The light emitting diodes are arranged at a lateral surface of the light guide panel. The light guide panel guides the light emitted from the light emitting diodes through a total reflection, and emits the light to the liquid crystal panel.

On the other hands, for the direct type backlight unit, no light guide panel is used and light emitting diodes are arranged at a rear surface of the light guide panel, whereby the light emitting diodes emit light toward the rear surface of the liquid crystal panel.

The backlight unit must uniformly emit light to the liquid crystal panel. That is, efforts are being waged to improve brightness uniformity of the liquid crystal display device.

DISCLOSURE OF INVENTION

Technical Problem

Accordingly, the teachings in accordance with exemplary and non-limiting embodiments of this invention provide an optical member configured to improve a light receiving efficiency and to miniaturize a luminous flux control member, and a display device having the same.

Solution to Problem

In order to accomplish the above object, the present invention provides an optical member, the optical member comprising: a driving substrate; a light source arranged on the driving substrate; a luminous flux control member arranged on the light source; and lug members arranged at a bottom surface of the luminous flux control member and extended to a direction of the light source.

Preferably, but not necessarily, the lug members include at least two or more lug members.

Preferably, but not necessarily, the lug members include a first lug member and a second lug member, and the light source is interposed between the first and second lug members.

Preferably, but not necessarily, each of the lug members takes a shape of a circle or a square.

Preferably, but not necessarily, each periphery of the lug members is coated with a reflective layer.

Preferably, but not necessarily, the lug members include a first surface orthogonal to a bottom surface of the luminous flux control member and a second surface slanted from the bottom surface of the luminous flux control member.

Preferably, but not necessarily, an angle between the second surface and the bottom surface of the luminous flux control member is 90°~180°.

Preferably, but not necessarily, a gap between the first surface and the second surface tapers off as the gap goes to the direction of the light source.

In another general aspect of the present invention, there is provided an optical member, the optical member comprising: a driving substrate; a light source arranged on the driving substrate; a diffusion lens arranged on the light source; and lug members arranged at a bottom surface of the diffusion lens and extended to a direction of the light source.

Preferably, but not necessarily, the diffusion lens includes a depression (dent) unit corresponding to the light source.

Preferably, but not necessarily, the lug members include a reflection layer.

Preferably, but not necessarily, the light source is positioned between the lug members.

In still another general aspect of the present invention, there is provided a display device, the display device comprising: an optical member; and a display panel incident with light emitted from the optical member, wherein the optical member includes a driving substrate, a light source arranged on the driving substrate; a luminous flux control member arranged on the light source; and lug members arranged at a bottom surface of the luminous flux control member and extended to a direction of the light source.

Preferably, but not necessarily, the lug members include at least two or more lug members.

Preferably, but not necessarily, the lug members include a first lug member and a second lug member, and the light source is interposed between the first and second lug members.

Preferably, but not necessarily, each periphery of the lug members is coated with a reflective layer.

Preferably, but not necessarily, the lug members include a first surface orthogonal to a bottom surface of the luminous flux control member and a second surface slanted from the bottom surface of the luminous flux control member.

Preferably, but not necessarily, an angle between the second surface and the bottom surface of the luminous flux control member is 90°~180°.

Preferably, but not necessarily, the luminous flux control member is connected to a fixation member to be fixed at the driving substrate.

Preferably, but not necessarily, the light source is positioned between the lug members.

Advantageous Effects of Invention

An optical member and a display device having the same member according to the exemplary embodiments of the present invention include lug members at a bottom surface of the luminous flux control member. Furthermore, a light source is positioned between the lug members. As a result, concentration efficiency of light emitted from the light source can be enhanced. That is, the light emitted from the light source passes an incident surface of the luminous flux control member, or is reflected from the incident surface and discharged to outside. An entire efficiency can be reduced due to decrease in light receiving efficiency, as the light reflected from the incident surface increases.

The optical member according to the exemplary embodiments of the present invention can return the light reflected from the incident surface back to a direction of the luminous flux control member using lug members. That is, the lug members can control an incident light distribution and a light receiving direction. Thus, the light generated from the light source and reflected by the incident surface can be reflected by the lug members and returned to a lens.

Furthermore, an incident angle of light generated by the light source can be made smaller to miniaturize the lens. That is, although increased light incident angle disadvantageously causes to increase a size of a lens, the incident light distribution can be controlled to allow obtaining a same light receiving effect with a smaller incident angle, whereby the size of lens can be miniaturized.

BRIEF DESCRIPTION OF DRAWINGS

The teachings of the present invention can be readily understood by considering the following Detailed Description in conjunction with the accompanying drawings, in which.

BEST MODE FOR CARRYING OUT THE INVENTION

Figure 1:
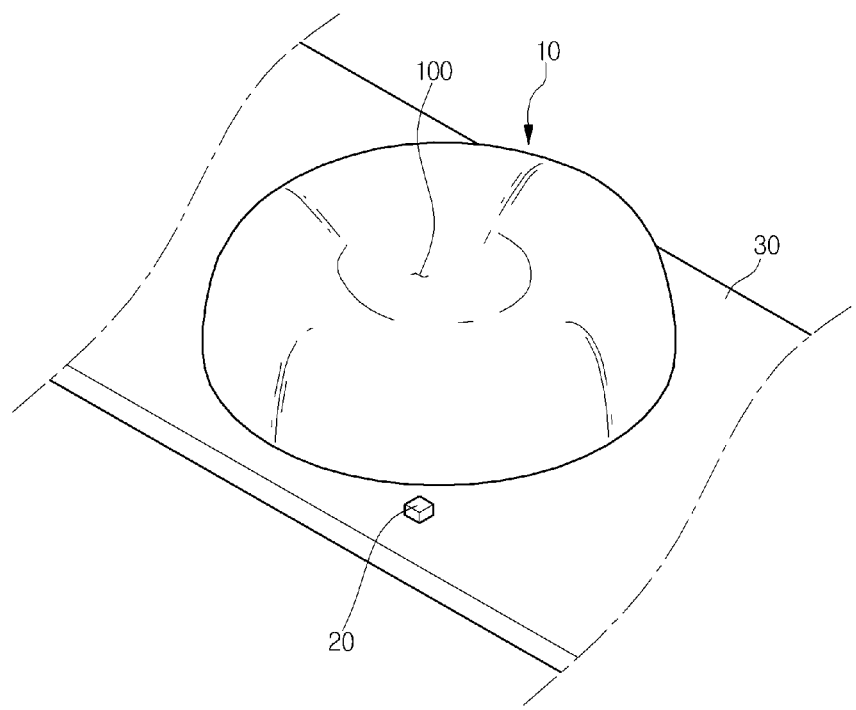
FIGS. 1 and 2 are exploded perspective views illustrating an optical member according to an exemplary embodiment of the present invention.

In the drawings, it will be understood that when a panel (a sheet, a member, a guide or a unit) is referred to as being 'on' or 'under' another panel (another sheet, another member, another guide or another unit), it can be directly on or under the other panel (sheet, member, guide or unit), or intervening panels (sheets, members, guides or units) may also be present. In the drawings, the dimensions, such as sizes or thicknesses, of layers or films are exaggerated, omitted, or schematically shown for clarity of illustration. Accordingly, the sizes of the devices in the drawings do not thoroughly reflect real sizes of devices. Furthermore, the term of 'surface' and 'plane' may be inter-changeably used.

Figure 2:
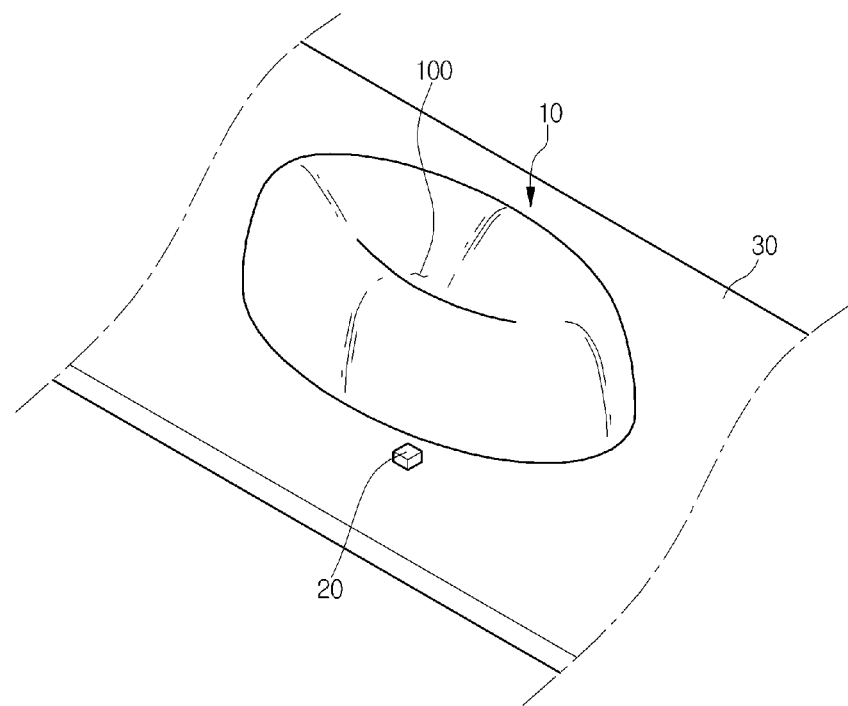
Figure 3:
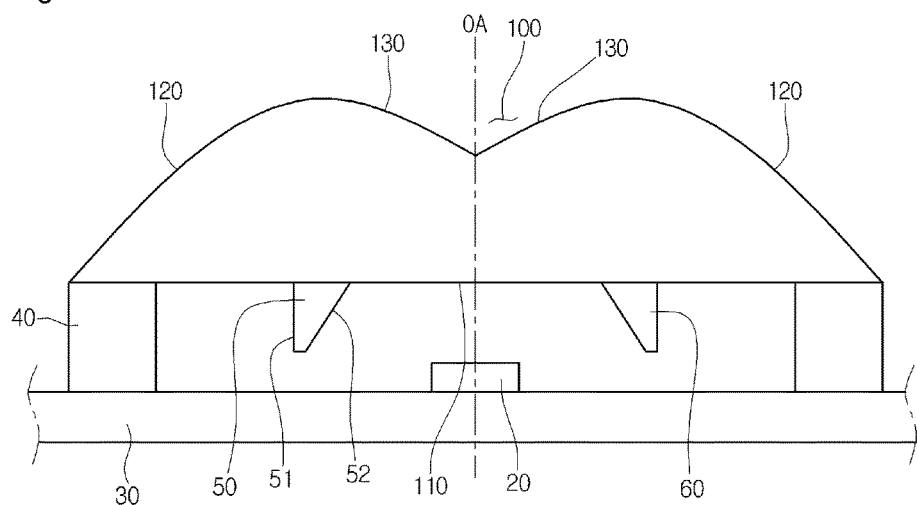
FIG. 3 is a cross-sectional view illustrating a cross-section of an optical member according to an exemplary embodiment of the present invention.
Figure 6:
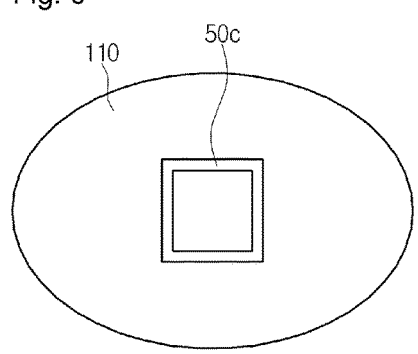
Figure 7:
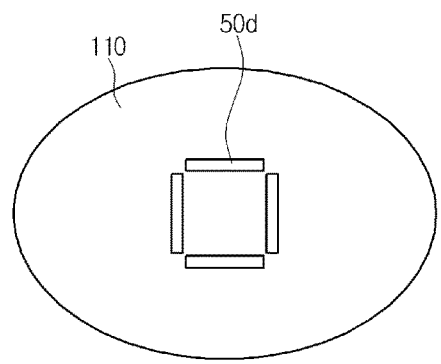
Figure 8:
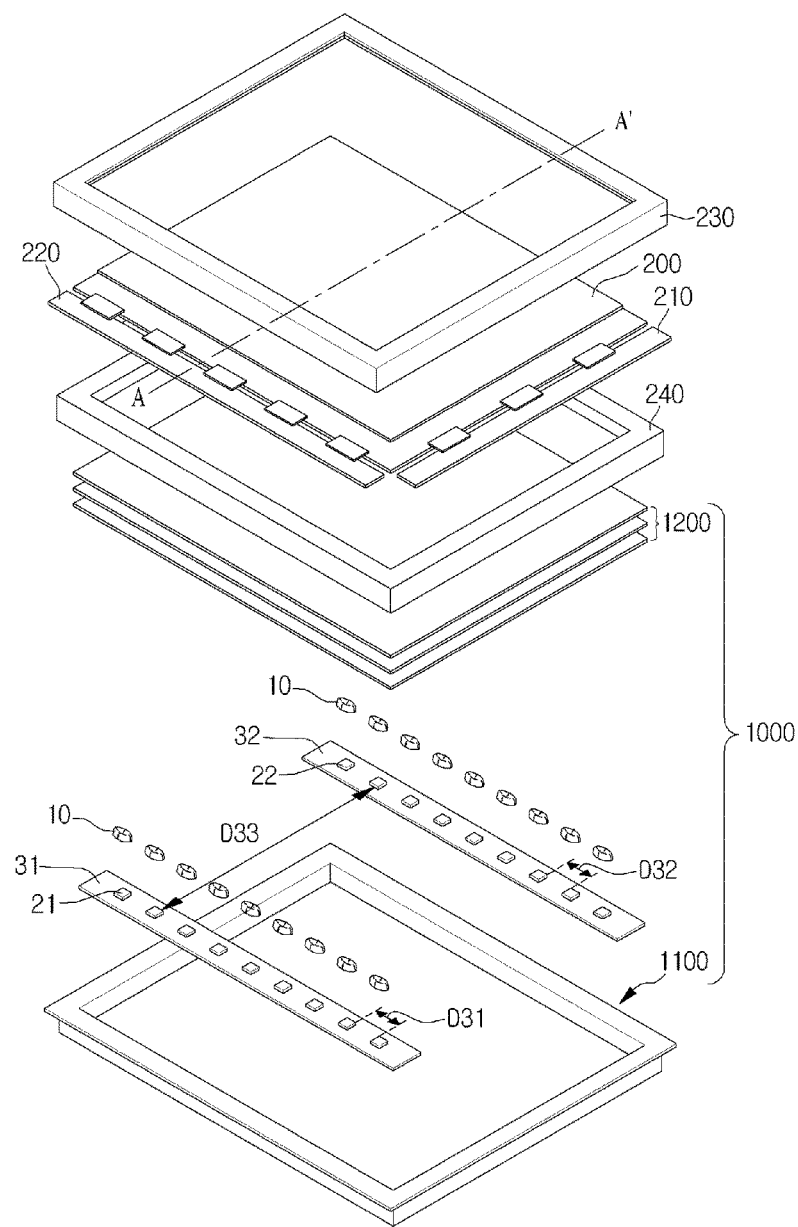
FIG. 8 is an exploded perspective view illustrating a liquid crystal display device according to an exemplary embodiment of the present invention.
Figure 9:
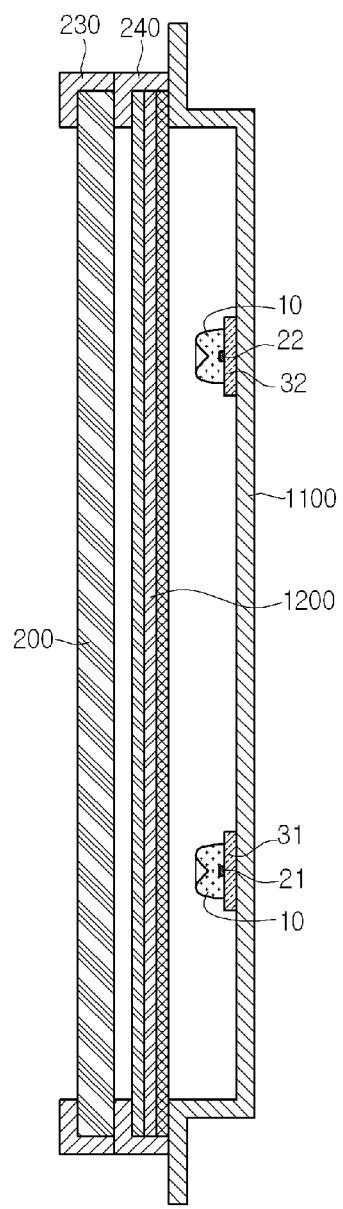
FIG. 9 is a cross-sectional view illustrating a cross-section taken along line A-A' of FIG. 8.

FIGS. 1 and 2 are exploded perspective views illustrating an optical member according to an exemplary embodiment of the present invention, FIG. 3 is a cross-sectional view illustrating a cross-section of an optical member according to an exemplary embodiment of the present invention, FIGS. 4 to 7 are schematic views illustrating various shape of a lug member according to an exemplary embodiment of the present invention, FIG. 8 is an exploded perspective view illustrating a liquid crystal display device according to an exemplary embodiment of the present invention, and FIG. 9 is a cross-sectional view illustrating a cross-section taken along line A-A' of FIG. 8.

Referring to FIGS. 1 to 7, an optical member includes a driving substrate, a light source arranged on the driving substrate, a luminous flux control member arranged on the light source, and lug members arranged at a bottom surface of the luminous flux control member and extended to a direction of the light source.

The driving substrate (30) supports the light source (20) and the luminous flux control member (10). The driving substrate (30) is electrically connected to the light source (20). The driving substrate (30) may be a PCB (Printed Circuit Board). Furthermore, the driving substrate (30) may be rigid or flexible.

The light source (20) emits light to a direction of the luminous flux control member (10). The light source (20) may be a light emitting diode package. That is, the light source (20) may be a light emitting diode package including a light emitting diode and a photo-converter. The light emitting diode (20) may be a point light source. The light emitting diode (20) is electrically connected to the driving substrate (30). The light emitting diode (20) may be mounted on the driving substrate (30). As a result, the light emitting diode (20) receives an electrical signal from the driving substrate (30). That is, the light emitting diode (20) is driven by the driving substrate (30) to thereby generate the light.

The luminous flux control member (10) is transparent. A refractive index of the luminous flux control member (10) may be approximately 1.4 to approximately 1.5. The luminous flux control member (10) may be formed with a transparent resin. The luminous flux control member (10) may include a thermoplastic resin. To be more specific, the luminous flux control member (10) may include a silicon resin. An example of material used for the luminous flux control member (10) may be PDMS (Polydimethylsiloxane).

The luminous flux control member (10) is arranged on the driving substrate (30). Furthermore, the luminous flux control member (10) is arranged on the light source (20). That is, the luminous flux control member (10) is arranged, being discrete from the driving substrate (30) and the light source (20) at a predetermined distance.

The luminous flux control member (10) may be a lens. Preferably, the luminous flux control member (10) may be a diffusion lens. The diffusion lens may be isotropic, or anisotropic. That is, the luminous flux control member (10) may be an isotropic lens, or an anisotropic lens as shown in FIG. 1.

The luminous flux control member (10) includes an incident surface (110), a refractive surface (120) and a reflective surface (130), where the incident surface (110), the refractive surface (120) and the reflective surface (130) are mutually connected. That is, the incident surface (110) is connected to the refractive surface (120) and the refractive surface (120) is connected to the reflective surface (130).

The luminous flux control member (10) is formed with a depression (dent) unit (100). The depression unit (100) is formed at an upper surface of the luminous flux control member (10). The depression unit (100) corresponds to the light source (20). The depression unit (100) is caved in toward the light source (20). To be more specific, the depression unit (100) is sunk in toward the light source (20). The depression unit (100) is formed in the center of the luminous flux control member (10).

A center of an inner surface of the depression unit (100) is arranged at an OA (Optical Axis) of the light source (20). That is, the OA of the light source (20) passes the center of the inner surface of the depression unit (100).

The incident surface (110) is positioned at a bottom surface of the luminous flux control member (10). The incident surface (110) receives the light emitted by the light source (20). That is, the luminous flux control member (10) receives the light generated by the light source (20) through the incident surface (110).

The reflective surface (130) is an inner surface of the depression unit (100).

The reflective surface (130) can reflect a part of the light from the light emitting diode (20) to any one direction of a lateral direction, a bottom lateral direction and an upper lateral direction. That is, the reflective surface (130) can reflect a part of the light emitted from the light emitting diode (20), received and emitted through the incident surface (10) to any one direction of a lateral direction, a bottom lateral direction and an upper lateral direction.

Thus, the reflective surface (130) can prevent generation of hot spot formed by concentration of light at a center portion of the luminous flux control member (10). Furthermore, the reflective surface (130) can reflect the light from the light source (20) to a direction of the refractive surface (120).

The reflective surface (130) is extended from the OA of the light source (20). To be more specific, the reflective surface (130) is extended to a direction distancing from the OA of the light source (20). At this time, the direction distancing from the OA of the light source (20) means a direction orthogonal to the OA of the light source (20) or an outside direction slanted from the OA of the light source (20). To be further specific, the reflective surface (130) is extended to an upper lateral direction from the OA of the light source (20), where the term of "OA (Optical Axis)" is a progressing direction of light at a center of 3-D luminous flux from a point light source.

A distance between the reflective surface (130) and the OA of the light emitting diode (20) may gradually increase as being distanced from the light emitting diode (20). To be more specific, the distance between the reflective surface (130) and the OA of the light emitting diode (20) may proportionally increase as being distanced from the light emitting diode (20).

The reflective surface (130) and the refractive surface (120) may meet together. The refractive surface (120) may be curved from the reflective surface (130) and extended downwards. That is, the refractive surface (120) may be curved from the reflective surface (130) and extended to the incident surface (110).

The refractive surface (120) receives the light emitted from the light source (20) and emits the light to the outside. To be more specific, the refractive surface (120) receives the light emitted from the light source (20) and emits to an outside display panel or the like. Furthermore, the refractive surface (120) refracts the light incident on the luminous flux control member (10). The refractive surface (120) is formed in a shape of a curvature or a straight line.

The refractive surface (120) is connected to the incident surface (110). To be more specific, the refractive surface (120) is connected to both distal ends of the incident surface (110) and extended upwards. To be further specific, the refractive surface (120) is extended from the incident surface (110) to a direction of the reflective surface (130).

The luminous flux control member (10) is connected by the driving substrate (30) and a fixation member (40). That is, the luminous flux control member (10) is connected and fixed by the fixation member positioned at an edge of the luminous flux control member (10), whereby the luminous flux control member (10) can be fixed to a center of the OA of the light source (20).

The optical member includes lug members. The lug members are arranged at a bottom surface of the luminous flux control member (10). Furthermore, the lug members are protrusively extended from the luminous flux control member (10) to a direction of the light source (20). The lug members include at least two lug members. That is, the lug members may include a first lug member (50) and a second lug member (60).

The first lug member (50) and the second lug member (60) are positioned in the fixation members (40). Furthermore, the light source (20) is positioned between the first lug member (50) and the second lug member (60). Each of the first lug member (50) and/or the second lug member (60) takes a shape of a circle or a square. To be more specific, each of the first lug member (50) and/or the second lug member (60) may take a shape of a cylinder or a square formed along a bottom surface of the luminous flux control member (10).

Furthermore, each of the first lug member (50) and/or the second lug member (60) may be extended from the bottom surface of the luminous flux control member (10) to the direction of the light source (20) in a vertical manner or a slanted manner.

Referring to FIG. 3, each of the first and/or second lug members (50, 60) may be formed with a slant. If explanation is focused on the first lug member (50), the first lug member (50) may include a first surface (51) orthogonal to the bottom surface of the luminous flux control member (10), and a second surface (52) slanted from the bottom surface of the luminous flux control member (10). Furthermore, a gap between the first and second surfaces tapers off as the lug members are extended to the direction of the light source (20).

That is, the first lug member (50) and the second lug member (60) may be orthogonal to or slanted from the bottom surface of the luminous flux control member (10). At this time, an angle between the second surface (52) and the bottom surface of the luminous flux control member (10), i.e., an angle of the incident surface (110) may be 90°~180°.

FIGS. 4 to 7 are schematic views illustrating various shapes of a lug member according to an exemplary embodiment of the present invention.

Figure 4:
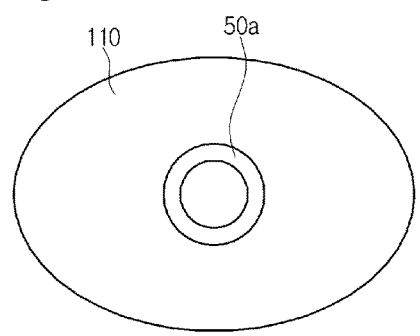
FIGS. 4 to 7 are schematic views illustrating various shapes of a lug member according to an exemplary embodiment of the present invention.
Figure 5:
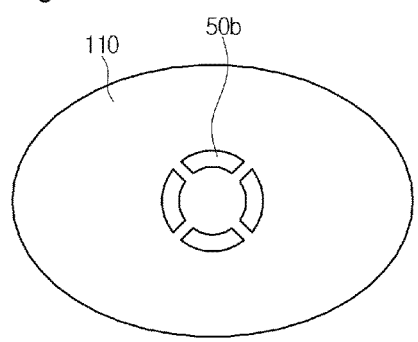

Referring to FIGS. 4 and 5, the lug members of the optical member may take a circle (50a, 50b). To be more specific, the lug members of the optical member may take a shape of a cylinder. The lug members may take a completely connected circular shape (50*a*) as shown in FIG. 4, or take a shape of a circular shape (50*b*) connected by four (4) curved lines at an interval as shown in FIG. 5. However, the present invention is not limited thereto. By way of non-limiting example, two (2) or three (3) curved lines, or five (5) or more curved lines may be separately connected.

Referring to FIGS. 6 and 7, each of the lug members may take a shape of a rectangle (50*c*, 50*d*). To be more specific, each of the lug members may take a shape of a rectangular barrel. The lug members may take a shape of a completely connected square (50*c*) as shown in FIG. 6, or a square (50*d*) formed by four (4) straight lines separately connected each at a predetermined interval as shown in FIG. 7.

The lug members may include reflective layers. To be more specific, each of the lug members may be coated with a reflective layer at a periphery. The reflective layer serves to reflect the reflection of light generated by the light source more easily. The optical member according to the exemplary embodiment of the present invention includes lug members at the bottom surface of the luminous flux control member. Furthermore, a light source is positioned between the lug members. As a result, concentration efficiency of light generated by the light source can be enhanced.

That is, the light generated by the light source passes the incident surface of the luminous flux control member, or is reflected from the incident surface and emitted to outside. As the light reflected from the incident surface increases, the light receiving efficiency may be reduced to decrease an entire efficiency.

The optical member according to the exemplary embodiment of the present invention can return the light reflected through the incident surface back to the direction of the luminous flux control member using the lug members. That is, the lug members can control the incident light distribution and light receiving direction, whereby the light generated by the light source and reflected by the incident surface can be reflected by the lug members and returned back to the lens.

Furthermore, an incident angle of light generated by the light source can be made smaller to implement miniaturization of the lens. That is, although there is a problem of increasing the size of the lens due to increased incident angle, the incident light distribution can be controlled by the lug members to obtain the same incident light efficiency as that of a small incident angle, thereby miniaturize the size of the lens.

A liquid crystal display device including a luminous flux control member according to an exemplary embodiment of the present invention will be illustrated and explained with reference to FIGS. 8 and 9.

FIG. 8 is an exploded perspective view illustrating a liquid crystal display device according to an exemplary embodiment of the present invention, and FIG. 9 is a cross-sectional view illustrating a cross-section taken along line A-A' of FIG. 8.

In the present exemplary embodiment, the aforementioned optical member will be used as reference. That is, explanation and illustration of the optical member according to the previous exemplary embodiments will be substantially combined with those of the present exemplary embodiment.

Referring to FIGS. 8 and 9, a liquid crystal display device according to the present exemplary embodiment includes a liquid crystal display panel (200) and a backlight unit (1000). The liquid crystal display panel (200) serves to display a picture data or an image.

Although not illustrated, the liquid crystal display panel (50) includes, for coherence to maintain a uniform gap by facing each other, a TFT (Thin Film Transistor) substrate, a C/F (Color Filter) substrate and a liquid crystal layer interposed between the TFT substrate and the C/F substrate. The TFT substrate is structurally configured such that a plurality of gate lines is formed, a plurality of data lines crossing the plurality of data lines is formed and TFTs are formed at a crossing area between the gate lines and the data lines.

The liquid crystal display panel (200) includes, at an edge thereof, a gate driving PCB (210) supplying a scan signal to the gate line, and a data driving PCB (220) supplying a data signal to the data line. The gate and data driving PCBs (210, 220) are electrically connected to the liquid crystal display panel (200) using a COF (Chip On Film), where the COF may be replaced by a TCP (Tape Carrier Package).

Furthermore, the liquid crystal display device according to the present exemplary embodiment includes a panel guide (240) supporting the liquid crystal display panel (200) and a top case (230) encompassing an edge of the liquid crystal display panel (20) and coupled to the panel guide (204).

The backlight unit (1000) is configured to be mounted on a large (20-inch or more) liquid crystal display device in a direct type method. The backlight unit (1000) includes a bottom cover (1100), a plurality of driving substrates (31, 32), a plurality of light emitting diodes (21, 22), a plurality of luminous flux control members (10, 10) and optical sheets (1200).

The bottom cover (1100) takes a shape of an upper surface-opened box to accommodate the driving substrate (31, 32). Furthermore, the bottom cover (1100) functions to support the optical sheets (1200) and the liquid crystal display panel (200). The bottom cover (1100) may be formed using a metal and the like. By way of non-limiting example, the bottom cover (1100) may be formed by bending or curving a metal plate. That is, the driving substrates (31, 32) are accommodated at a space formed by the bending and curving the metal plate.

Furthermore, a floor surface of the bottom cover (1100) may have a high reflectivity. That is, the floor surface itself of the bottom cover (1100) may function as a reflective sheet. Alternatively, although not illustrated, a reflective sheet may be separately arranged inside the bottom cover (1100).

The driving substrates (31, 32) are arranged inside the bottom cover (1100). Each of the driving substrates (31, 32) may be a driving substrate for driving the light source (20). The driving substrates (31, 32) are electrically connected to the light emitting diodes (21, 22). That is, the light emitting diodes (21, 22) may be mounted on the driving substrates (31, 32).

Referring to FIG. 9, each of the driving substrates (31, 32) may take a shape extended to a first direction. To be more specific, each of the driving substrates (31, 32) may be extended in parallel to the first direction. Each of the driving substrates (31, 32) may take a shape of a strip extended to the first direction. Two or more driving substrates (32, 32) may be provided in the exemplary embodiment. The number of the driving substrates (32, 32) may be dependent on an area of the liquid crystal display panel (200). The driving substrates (31, 32) may be arranged in parallel. Each length of the driving substrates (32, 32) may be dependent on a width of the liquid crystal display panel (200). Each width of the driving substrates (32, 32) may be approximately 5 mm~approximately 3 cm.

The driving substrates (31, 32) are electrically connected to the light emitting diodes (21, 22) and supply a driving signal to the light emitting diodes (21, 22). The driving substrates (31, 32) may be coated at an upper surface thereof with a reflective layer for enhancing performance of the backlight unit (1000). That is, the reflective layer can reflect the light emitted from the light emitting diodes (21, 22) to an upward direction.

The light emitting diodes (21, 22) generate light using an electrical signal applied through the driving substrates (31, 32). That is, the light emitting diodes (21, 22) are light sources. To be more specific, each of the light emitting diodes (21, 22) is a point light source, and each of the light emitting diodes (21, 22) are gathered to form a surface light source, where the light emitting diodes (21, 22) are a light emitting diode package including light emitting diode chips.

The light emitting diodes (21, 22) are mounted on the driving substrates (31, 32). The light emitting diodes (21, 22) may emit white light. Alternatively, the light emitting diodes (21, 22) may emit blue light, green light and red light on an even dividing manner.

Furthermore, the luminous flux control members (10) are arranged on the driving substrates (31, 32). To be more specific, each of the luminous flux control members (10) is arranged on the light emitting diodes (21, 22). The luminous flux control members (10) can cover each of the light emitting diodes (21, 22). The luminous flux control members (10) are connected to and fixed on the driving substrates.

The luminous flux control members (10) include the lug members. To be more specific, the lug members are arranged at the bottom surface of the luminous flux control members (10). The luminous flux control members (10) include the lug members protruded to a direction of the light source. The explanation of the lug members are substantially same as that of previous exemplary embodiments and substantially combined to the previous exemplary embodiments.

The light emitting diodes (21, 22) may include first light emitting diodes (21) and second light emitting diodes (22). The first light emitting diodes (21) are arranged on the first driving substrate (31). The first light emitting diodes (21) may be mounted on the first driving substrate (31). To be more specific, the first light emitting diodes (21) may be arranged in a row to a first direction. That is, the first light emitting diodes (21) may be mounted in a row on the first driving substrate (31). Furthermore, the first light emitting diodes (21) may be discrete at a predetermined gap (D31).

The second light emitting diodes (22) are arranged on the second driving substrate (32). The second light emitting diodes (22) may be mounted on the second driving substrate (32). To be more specific, the second light emitting diodes (22) may be arranged in a row to the first direction. That is, the second light emitting diodes (22) may be mounted in a row on the second driving substrate (32). Furthermore, the second light emitting diodes (22) may be mounted discrete at a predetermined gap (D32).

The first light emitting diodes (21) may be arranged in a first row, and the second light emitting diodes (22) may be arranged in a second row. The first and second rows may be arranged in parallel at a predetermined gap (D33).

The optical sheets (1200) are arranged on the light emitting diodes (21, 22). The optical sheets (1200) may be arranged on the bottom cover (1100). The optical sheets (1200) may cover the light emitting diodes (21, 22).

The optical sheets (1200) can enhance the characteristics of passing light. The optical sheets (1200) may include a diffusion sheet, a first prism sheet and a second prism sheet.

The diffusion sheet is arranged on the light emitting diodes (21, 22). The diffusion sheet covers the light emitting diodes (21, 22). To be more specific, the diffusion sheet may cover an entire area of the light emitting diodes (21, 22).

The light emitted from the light emitting diodes (21, 22) is incident on the diffusion sheet. The light emitted from the light emitting diodes (21, 22) may be diffused by the diffusion sheet.

The first prism sheet is arranged on the diffusion sheet. The first prism sheet may include a pattern having a shape of a pyramid. The first prism sheet can enhance the straightness of light from the diffusion sheet. The second prism sheet is arranged on the first prism sheet. The second prism sheet may include a pattern having a shape of a pyramid. The second prism sheet can enhance the straightness of light from the first prism sheet.

As explained above, the optical member according to the exemplary embodiments of the present invention includes lug members formed at a bottom surface of the luminous flux control member. Furthermore, a light source is positioned between the lug members. As a result, concentration efficiency of light generated by the light source can be enhanced.

That is, the light generated by the light source passes the incident surface of the luminous flux control member, or is reflected from the incident surface and emitted to outside. As the light reflected from the incident surface increases, the light receiving efficiency may be reduced to decrease an entire efficiency.

The optical member according to the exemplary embodiment of the present invention can return the light reflected through the incident surface back to the direction of the luminous flux control member using the lug members. That is, the lug members can control the incident light distribution and light receiving direction, whereby the light generated by the light source and reflected by the incident surface can be reflected by the lug members and returned back to the lens.

Furthermore, an incident angle of light generated by the light source can be made smaller to implement miniaturization of the lens. That is, although there is a problem of increasing the size of the lens due to increased incident angle, the incident light distribution can be controlled by the lug members to obtain the same incident light efficiency as that of a small incident angle, thereby miniaturize the size of the lens.

What has been described above in terms of characteristics, structures and effects includes examples of one or more aspects. It is, of course, not possible to describe every conceivable combination of components or methodologies for purposes of describing the aforementioned aspects, but one of ordinary skill in the art may recognize that many further combinations and permutations of various aspects are possible. Accordingly, the described aspects are intended to embrace all such alterations, modifications, and variations that fall within the scope of the appended claims.

While the present invention has been described with respect to the above exemplary embodiments, the present invention is not so limited and should be understood to be merely exemplary. Various modifications to the invention will be readily apparent to those skilled in the art, and the generic principles defined herein may be applied to other variations without departing from the spirit or scope of the invention. For example, each constituent element explained in detail in the above exemplary embodiments may be implemented in other various modifications.

INDUSTRIAL APPLICABILITY

The exemplary embodiments of the present invention provide an optical member and a display device having the optical member capable of enhancing the concentration efficiency of light generated by the light source by including lug members at a bottom surface of luminous flux control member.

The invention claimed is:

1. An optical member comprising:
   a driving substrate;
   a light source arranged on the driving substrate;
   a luminous flux control member spaced apart from the light source;
   a lug member arranged at the luminous flux control member and extended in a direction of the light source; and
   a fixation member disposed at an edge of the luminous flux control member between the driving substrate and the luminous flux control member;
   wherein the luminous flux control member includes a bottom surface being flat and positioned in parallel with the driving substrate, and an upper surface formed with a depression unit being recessed toward the light source; and
   wherein a height of the fixation member is greater than that of the lug member.

2. The optical member of claim 1, wherein the lug member includes one or more lug member sections.

3. The optical member of claim 1, wherein the lug member takes a shape of a circle or a square.

4. The optical member of claim 1, wherein a surface of the lug member is coated with a reflective layer.

5. The optical member of claim 1, wherein the lug member includes a first surface orthogonal to a bottom surface of the luminous flux control member and a second surface slanted with respect to the bottom surface of the luminous flux control member.

6. The optical member of claim 2, wherein the lug member includes a first lug member section and a second lug member section corresponding to the first lug member section, and wherein the light source is interposed between the first and second lug member sections.

7. The optical member of claim 3, wherein the circular shape of the lug member is formed by two or more discrete curved lines spaced apart with an interval.

8. The optical member of claim 3, wherein the square shape of the lug member is formed by two or more discrete straight lines spaced apart with an interval.

9. The optical member of claim 5, wherein an angle between the second surface and the bottom surface of the luminous flux control member is in a range of 90°~180°.

10. The optical member of claim 5, wherein a gap between the first surface and the second surface tapers off along the direction of the light source.

11. An optical member comprising:
    a driving substrate;
    a light source arranged on the driving substrate;
    a diffusion lens arranged on the light source;
    a fixation member disposed at an edge of the diffusion lens between the driving substrate and the diffusion lens; and
    a lug member arranged at a bottom surface of the diffusion lens and extended in a direction of the light source,
    wherein the lug member includes a first lug member section and a second lug member section corresponding to the first lug member section,
    wherein the bottom surface of the diffusion lens is flat and separated from the driving substrate by the fixation member,
    wherein an upper surface of the diffusion lens is formed with a depression unit arranged in an optical axis direction of the light source, and
    wherein a height of the fixation member is greater than that of the lug member.

12. The optical member of claim 11, wherein the depression unit is caved in toward the light source and corresponds to the light source.

13. The optical member of claim 11, wherein the lug member includes a reflection layer.

14. The optical member of claim 11, wherein the light source is positioned between the first and second lug member sections.

15. A display device comprising:
    an optical member; and
    a display panel illuminated by light emitted from the optical member,
    wherein the optical member includes a driving substrate,
    a light source arranged on the driving substrate,
    a luminous flux control member arranged on the light source, and
    a lug member arranged at the luminous flux control member and extended in a direction of the light source;
    wherein the luminous flux control member includes a bottom surface being flat and positioned in parallel with the driving substrate and an upper surface formed with a depression unit being recessed toward the light source,
    wherein the luminous flux control member is separated from the driving substrate by a fixation member positioned at an edge of the luminous flux control member, and
    wherein a height of the fixation member is greater than that of the lug member.

16. The display device of claim 15, wherein the lug member includes a first lug member section and a second lug member section, and the light source is interposed between the first and second lug member sections.

17. The display device of claim 15, wherein a surface of the lug member is coated with a reflective layer.

18. The display device of claim 15, wherein the lug member includes a first surface orthogonal to a bottom surface of the luminous flux control member and a second surface slanted with respect to the bottom surface of the luminous flux control member.

19. The display device of claim 15, wherein the luminous flux control member is connected to the fixation member to be fixed at the driving substrate.

20. The display device of claim 16, wherein the light source is positioned between the first and second lug member sections.

* * * * *